United States Patent
Liao

(10) Patent No.: US 12,080,598 B2
(45) Date of Patent: Sep. 3, 2024

(54) METHOD FOR PREPARING SEMICONDUCTOR DEVICE STRUCTURE WITH SILICIDE PORTION BETWEEN CONDUCTIVE PLUGS

(71) Applicant: NANYA TECHNOLOGY CORPORATION, New Taipei (TW)

(72) Inventor: Chun-Cheng Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 436 days.

(21) Appl. No.: 17/520,991

(22) Filed: Nov. 8, 2021

(65) Prior Publication Data

US 2023/0141895 A1 May 11, 2023

(51) Int. Cl.
*H01L 21/768* (2006.01)
*H01L 23/522* (2006.01)

(52) U.S. Cl.
CPC .... *H01L 21/76897* (2013.01); *H01L 21/7685* (2013.01); *H01L 21/76864* (2013.01); *H01L 21/76885* (2013.01); *H01L 23/5226* (2013.01)

(58) Field of Classification Search
CPC ........... H01L 21/76897; H01L 21/7685; H01L 21/76864; H01L 21/76885; H01L 23/5226; H01L 21/76858; H01L 21/76849; H10B 12/09
See application file for complete search history.

(56) References Cited

U.S. PATENT DOCUMENTS

| | | | | |
|---|---|---|---|---|
| 5,736,455 A | * | 4/1998 | Iyer | H01L 21/76889 438/653 |
| 6,432,766 B1 | * | 8/2002 | Choi | H10B 10/15 438/383 |
| 6,762,924 B2 | * | 7/2004 | Fazan | H01L 21/7687 361/321.1 |
| 2006/0131630 A1 | * | 6/2006 | Sun | H01L 21/76897 257/E21.018 |
| 2014/0179102 A1 | * | 6/2014 | Joung | H10B 12/0335 438/666 |
| 2015/0056801 A1 | * | 2/2015 | Park | H01L 21/7682 438/655 |
| 2021/0335792 A1 | * | 10/2021 | Su | H10B 12/34 |

FOREIGN PATENT DOCUMENTS

TW  202038381 A  10/2020
TW  202141736 A  11/2021

* cited by examiner

*Primary Examiner* — Yasser A Abdelaziz
(74) *Attorney, Agent, or Firm* — Xuan Zhang

(57) ABSTRACT

A method for preparing a semiconductor device structure includes forming a first dielectric layer over a semiconductor substrate; forming a first conductive plug in the first dielectric layer; forming a polysilicon layer covering the first dielectric layer and the first conductive plug; transforming a portion of the polysilicon layer into a silicide portion; forming a second conductive plug directly over the silicide portion; and forming a second dielectric layer surrounding the second conductive plug.

11 Claims, 20 Drawing Sheets

METHOD FOR PREPARING SEMICONDUCTOR DEVICE STRUCTURE WITH SILICIDE PORTION BETWEEN CONDUCTIVE PLUGS

TECHNICAL FIELD

The present disclosure relates to a method for preparing a semiconductor device structure, and more particularly, to a method for preparing a semiconductor device structure with a silicide portion between conductive plugs.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer, and a second conductive plug disposed in the second dielectric layer and directly over the first conductive plug. The semiconductor device structure further includes a silicide portion disposed between the first conductive plug and the second conductive plug.

In an embodiment, the silicide portion is in direct contact with the first conductive plug and the second conductive plug. In an embodiment, a width of the silicide portion is substantially the same as a width of the second conductive plug. In an embodiment, the semiconductor device structure further includes a liner separating the first conductive plug from the first dielectric layer and the semiconductor substrate. In an embodiment, the liner is in direct contact with the silicide portion. In an embodiment, the semiconductor device structure further includes a polysilicon layer disposed between the first dielectric layer and the second dielectric layer.

In an embodiment, the silicide portion is surrounded by the polysilicon layer. In an embodiment, the silicide portion is in direct contact with the polysilicon layer. In an embodiment, the semiconductor device structure further includes a third conductive plug surrounded by the first dielectric layer, the polysilicon layer and the second dielectric layer, wherein the first conductive plug, the second conductive plug and the silicide portion are disposed in a pattern-dense region, and the third conductive plug is disposed in a pattern-loose region. In an embodiment, a width of the third conductive plug is greater than a width of the second conductive plug.

In another embodiment of the present disclosure, a semiconductor device structure is provided. The semiconductor device structure includes a first dielectric layer disposed over a semiconductor substrate, and a polysilicon layer disposed over the first dielectric layer. The semiconductor device structure also includes a second dielectric layer disposed over the polysilicon layer, and a first conductive plug disposed in the first dielectric layer. The semiconductor device structure further includes a silicide portion disposed in the polysilicon layer and covering the first conductive plug, and a second conductive plug disposed in the second dielectric layer and covering the silicide portion.

In an embodiment, the second conductive plug is in direct contact with the silicide portion, and a top surface area of the silicide portion is substantially the same as a bottom surface area of the second conductive plug. In an embodiment, the silicide portion is surrounded by and in direct contact with the polysilicon layer. In an embodiment, the polysilicon layer is in direct contact with the first dielectric layer and the second dielectric layer. In an embodiment, the semiconductor device structure further includes a liner separating the first conductive plug from the first dielectric layer.

In an embodiment, the liner and the first conductive plug collectively form a conductive structure, and a width of the conductive structure is substantially the same as a width of the silicide portion. In an embodiment, a top surface of the liner is in direct contact with a bottom surface of the silicide portion. In an embodiment, the semiconductor device structure further includes a third conductive plug surrounded by the first dielectric layer, the polysilicon layer and the second dielectric layer, wherein a width of the third conductive plug is greater than a width of the second conductive plug. In an embodiment, the first conductive plug, the second conductive plug and the silicide portion are disposed in an array region, and the third conductive plug is disposed in a peripheral circuit region.

In yet another embodiment of the present disclosure, a method for preparing a semiconductor device structure is provided. The method includes forming a first dielectric layer over a semiconductor substrate, and forming a first conductive plug in the first dielectric layer. The method also includes forming a polysilicon layer covering the first dielectric layer and the first conductive plug, and transforming a portion of the polysilicon layer into a silicide portion. The method further includes forming a second conductive plug directly over the silicide portion, and forming a second dielectric layer surrounding the second conductive plug.

In an embodiment, the transforming includes performing a heat treatment process on the polysilicon layer. In an embodiment, the portion of the polysilicon layer is in direct contact with the first conductive plug. In an embodiment, the silicide portion is entirely covered by the second conductive plug before the second dielectric layer is formed. In an embodiment, the second dielectric layer is formed over and in direct contact with a remaining portion of the polysilicon layer after the second conductive plug is formed. In an embodiment, the method further includes forming a first opening penetrating through the first dielectric layer to expose the semiconductor substrate, and forming a lining material over the first dielectric layer and lining the first opening. In addition, the method includes forming a conductive material over the lining material and filling the first opening, and planarizing the lining material and the conductive material to form a liner separating the first conductive plug from the first dielectric layer and the semiconductor substrate.

In an embodiment, the liner is covered by the polysilicon layer before the portion of the polysilicon layer is transformed. In an embodiment, the liner is covered by the silicide portion after the portion of the polysilicon layer is transferred. In an embodiment, the method further includes forming a second opening penetrating through the first dielectric layer, the polysilicon layer and the second dielectric layer to expose the semiconductor substrate, and forming a third conductive plug in the second opening. In an embodiment, the first opening is in a pattern-dense region, and the second opening is in a pattern-loose region. In an embodiment, a width of the second opening is greater than a width of the first opening.

Embodiments of a semiconductor device structure and method for preparing the same are provided in the disclosure. In some embodiments, the semiconductor device structure includes a first conductive plug and a second conductive plug directly over the first conductive plug, and a silicide portion disposed between the first conductive plug and the second conductive plug. The processes for forming the two conductive plugs can help to eliminate the problems of having overhang resulting from the difficulties in filling a high aspect ratio opening structure.

Moreover, the second conductive plug is formed over the silicide portion by a self-aligned process, and the second conductive plug is formed before the surrounding dielectric layer is formed. Therefore, there is no need to etch the dielectric layer surrounding the second conductive plug. As a result, the possibility of gap formation between the conductive plugs and the surrounding dielectric layers can be reduced, and the risk of misalignment between the first conductive plug and the second conductive plug can be prevented. As a result, the performance, reliability and yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
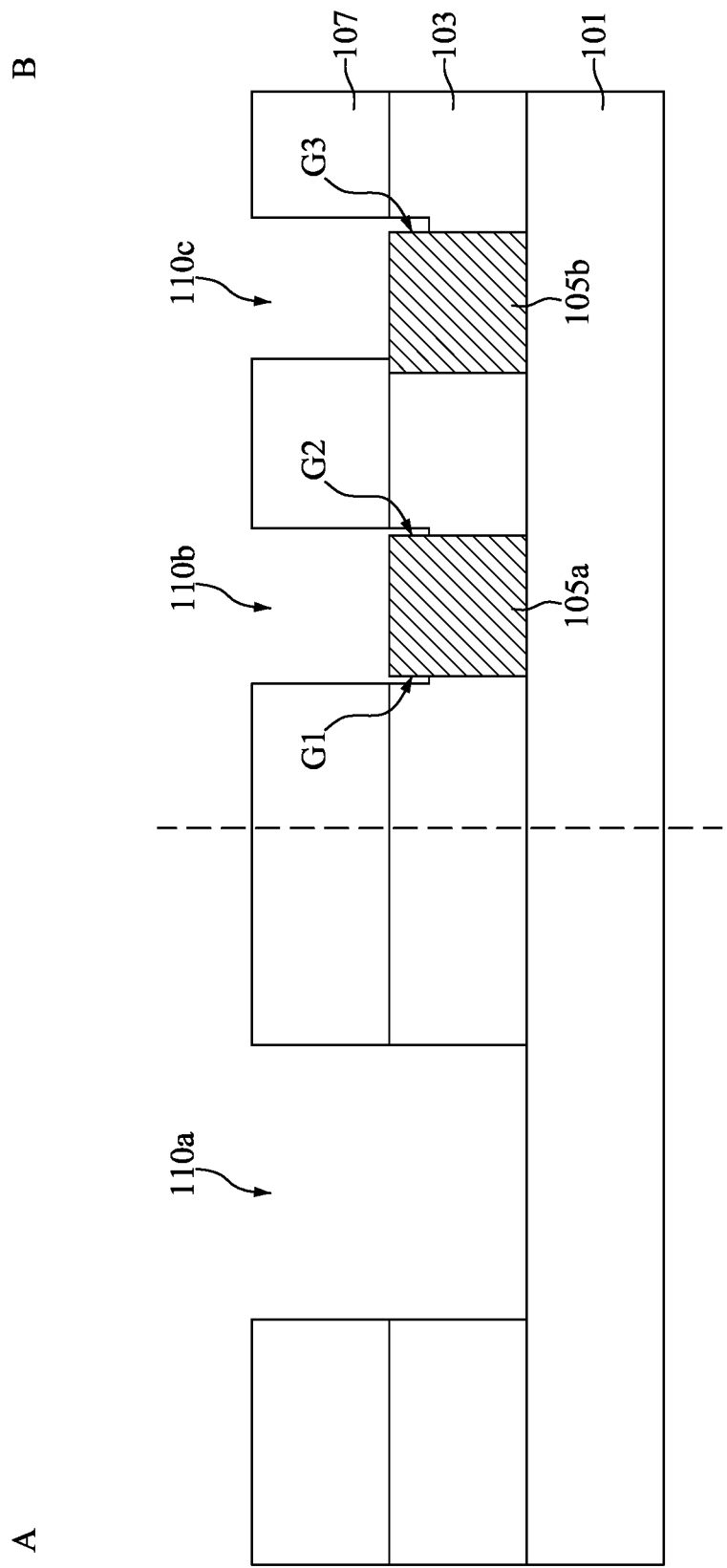
FIG. 1 is a cross-sectional view illustrating an intermediate stage of a process for forming a semiconductor device structure according to a comparative example.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
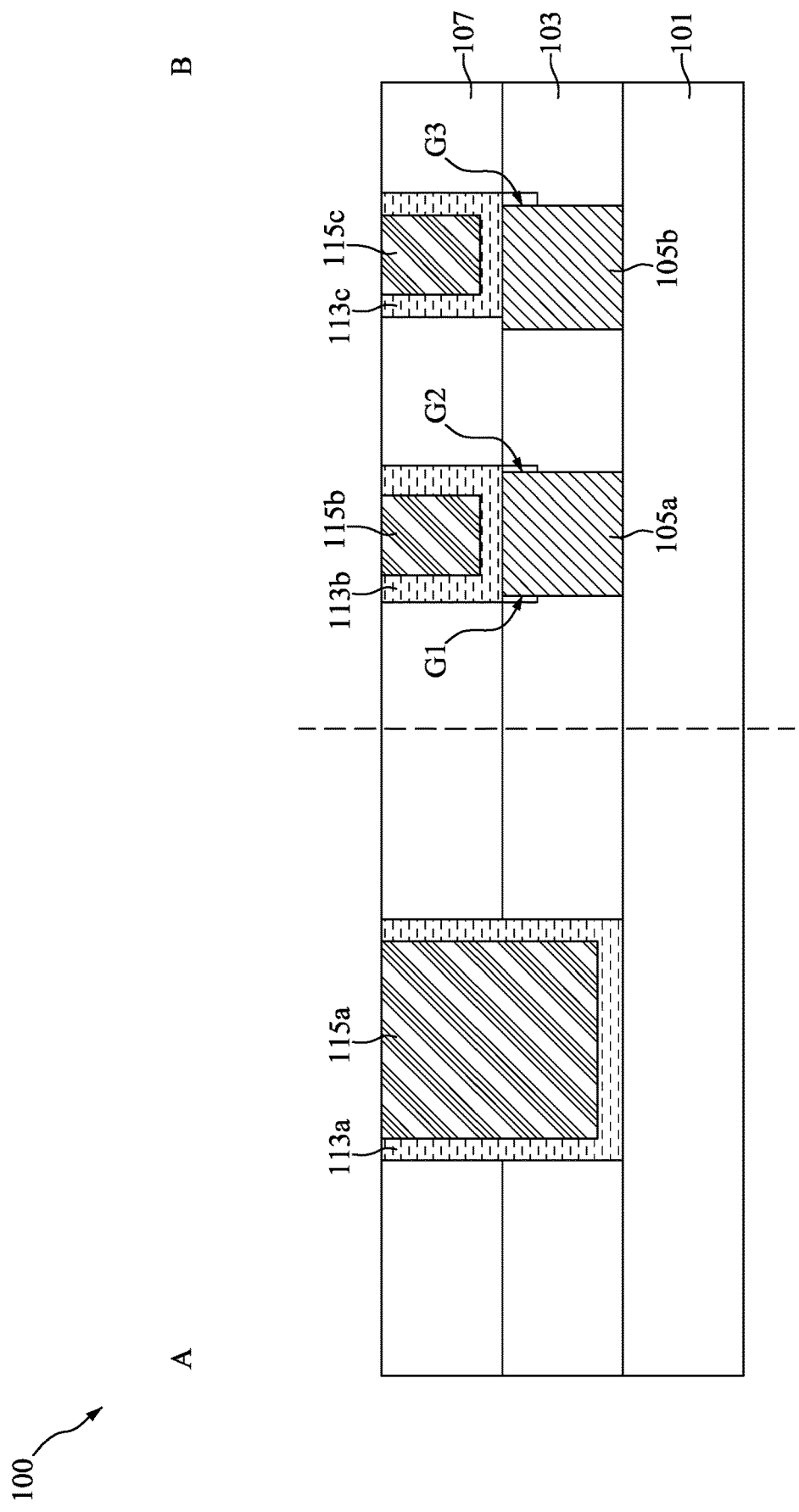
FIG. 2 is a cross-sectional view illustrating a semiconductor device structure according to a comparative example.

FIGS. 1 and 2 are cross-sectional views illustrating intermediate stages of a process for forming a semiconductor device structure 100 according to a comparative example. In this comparative example, a semiconductor substrate 101 is provided, a first dielectric layer 103 and conductive plugs 105a, 105b surrounding by the first dielectric layer 103 are disposed over the semiconductor substrate 101, and a second dielectric layer 107 is disposed over the first dielectric layer 103.

Moreover, the structure of FIG. 1 has a pattern-loose region A (i.e., peripheral circuit region) and a pattern-dense region B (i.e., array region). An opening 110a penetrating through the first dielectric layer 103 and the second dielectric layer 107 is in the pattern-loose region A, and openings 110b and 110c penetrating through the second dielectric layer 107 are in the pattern-dense region B. The conductive plug 105a is exposed by the opening 110b, and the conductive plug 105b is exposed by the opening 110c. In order to clarify the disclosure, the dotted line in the middle of FIG. 1 is used to indicate the boundary of the pattern-loose region A and the pattern-dense region B.

During the process for forming the openings 110a, 110b and 110c, some level of misalignment may occur due to a variety of overlay alignments shift defect in the photolithography process, which leads to the formation of gaps G1, G2 and G3 around the conductive plugs 105a and 105b, as shown in FIG. 1. Then, as shown in FIG. 2, liners 113a, 113b, 113c and conductive plugs 115a, 115b, 115c are formed in the openings 110a, 110b, 110c. Since the gaps G1, G2 and G3 are too small to be filled, the gaps G1, G2 and G3 are sealed in the semiconductor device structure 100 which can degrade device performance.

Figure 3:
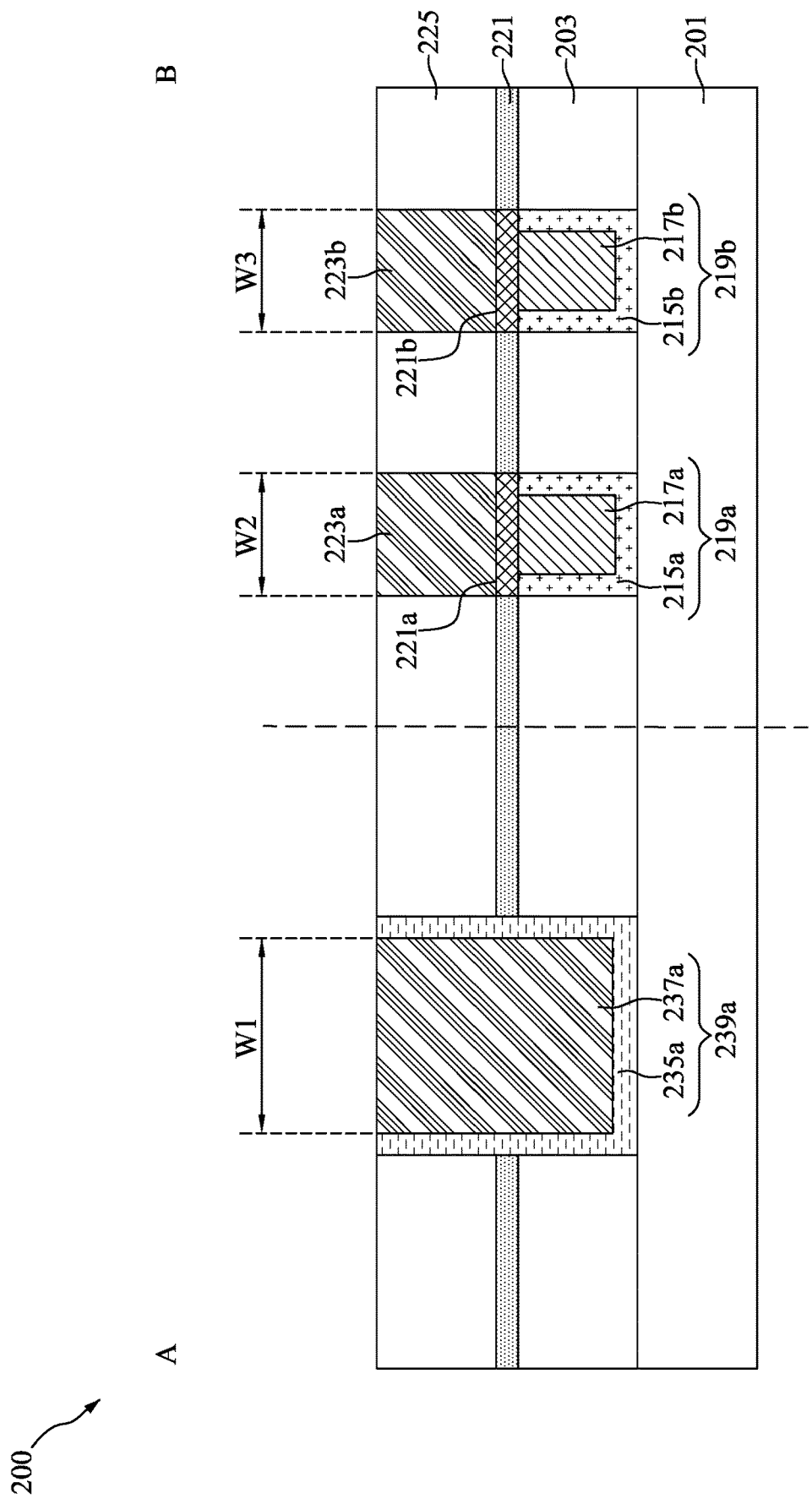
FIG. 3 is a cross-sectional view illustrating a semiconductor device structure according to various embodiments of the present disclosure.

FIG. 3 is a cross-sectional view illustrating a semiconductor device structure 200 according to various embodiments of the present disclosure. As shown in FIG. 3, the semiconductor device structure 200 includes a semiconductor substrate 201 and a first dielectric layer 203 disposed over the semiconductor substrate 201, in accordance with some embodiments. In addition, the semiconductor device structure 200 includes a polysilicon layer 221 disposed over the first dielectric layer 203, and a second dielectric layer 225 disposed over the polysilicon layer 221, in accordance with some embodiments.

In some embodiments, the semiconductor device structure 200 has a pattern-loose region A and a pattern-dense region B. The pattern-loose region A may also be referred to as a peripheral circuit region, and the pattern-dense region B may also be referred to as an array region. In the pattern loose region A, the semiconductor device structure 200 includes a conductive structure 239a surrounded by the first dielectric layer 203, the polysilicon layer 221 and the second dielectric layer 225.

In some embodiments, the conductive structure 239a includes a conductive plug 237a and a liner 235a surrounding the conductive plug 237a. In some embodiments, the conductive plug 237a is disposed in the first dielectric layer 203 and penetrating through the polysilicon layer 221 and the second dielectric layer 225. In some embodiments, the bottom surface and the sidewalls of the conductive plug 237a are covered by the liner 235a, such that the conductive plug 237a is separated from the semiconductor substrate 201, the first dielectric layer 203, the polysilicon layer 221 and the second dielectric layer 225 by the liner 235a.

In the pattern-dense region B, the semiconductor device structure 200 includes conductive structures 219a, 219b disposed in the first dielectric layer 203, silicide portions 221a, 221b disposed in the polysilicon layer 221 and directly over the conductive structures 219a, 219b, and conductive plugs 223a, 223b disposed in the second dielectric layer 225 and directly over the silicide portions 221a, 221b. In some embodiments, the conductive structure 219a includes a conductive plug 217a and a liner 215a surrounding the conductive plug 217a, and the conductive structure 219b includes a conductive plug 217b and a liner 215b surrounding the conductive plug 217b. In some embodiments, the bottom surface and the sidewalls of the conductive plug 217a are covered by the liner 215a, such that the conductive plug 217a is separated from the semiconductor substrate 201 and the first dielectric layer 203 by the liner 215a.

Moreover, in some embodiments, the bottom surface and the sidewalls of the conductive plug 217b are covered by the liner 215b, such that the conductive plug 217b is separated from the semiconductor substrate 201 and the first dielectric layer 203 by the liner 215b. In some embodiments, the conductive plug 223a is electrically connected to the conductive structure 219a through the silicide portion 221a, and the conductive plug 223b is electrically connected to the conductive structure 219b through the silicide portion 221b.

In some embodiments, the conductive plug 239a in the pattern-loose region A has a width W1, the conductive plug 223a in the pattern-dense region B has a width W2, and the conductive plug 223b in the pattern-dense region B has a width W3. In some embodiments, the width W2 is substantially the same as the width W3, and the width W1 is greater than each of the widths W2 and W3. Within the context of this disclosure, the word "substantially" means preferably at least 90%, more preferably 95%, even more preferably 98%, and most preferably 99%.

In some embodiments, the semiconductor device structure 200 is a dynamic random access memory (DRAM). In this case, the conductive structures 219a, 219b and the conductive plugs 223a, 223b can serve as bit line (BL) contact plugs, capacitor contact plugs and/or interconnect structures which provide vertical electrical conduction pathways in the DRAM structure.

Figure 4:
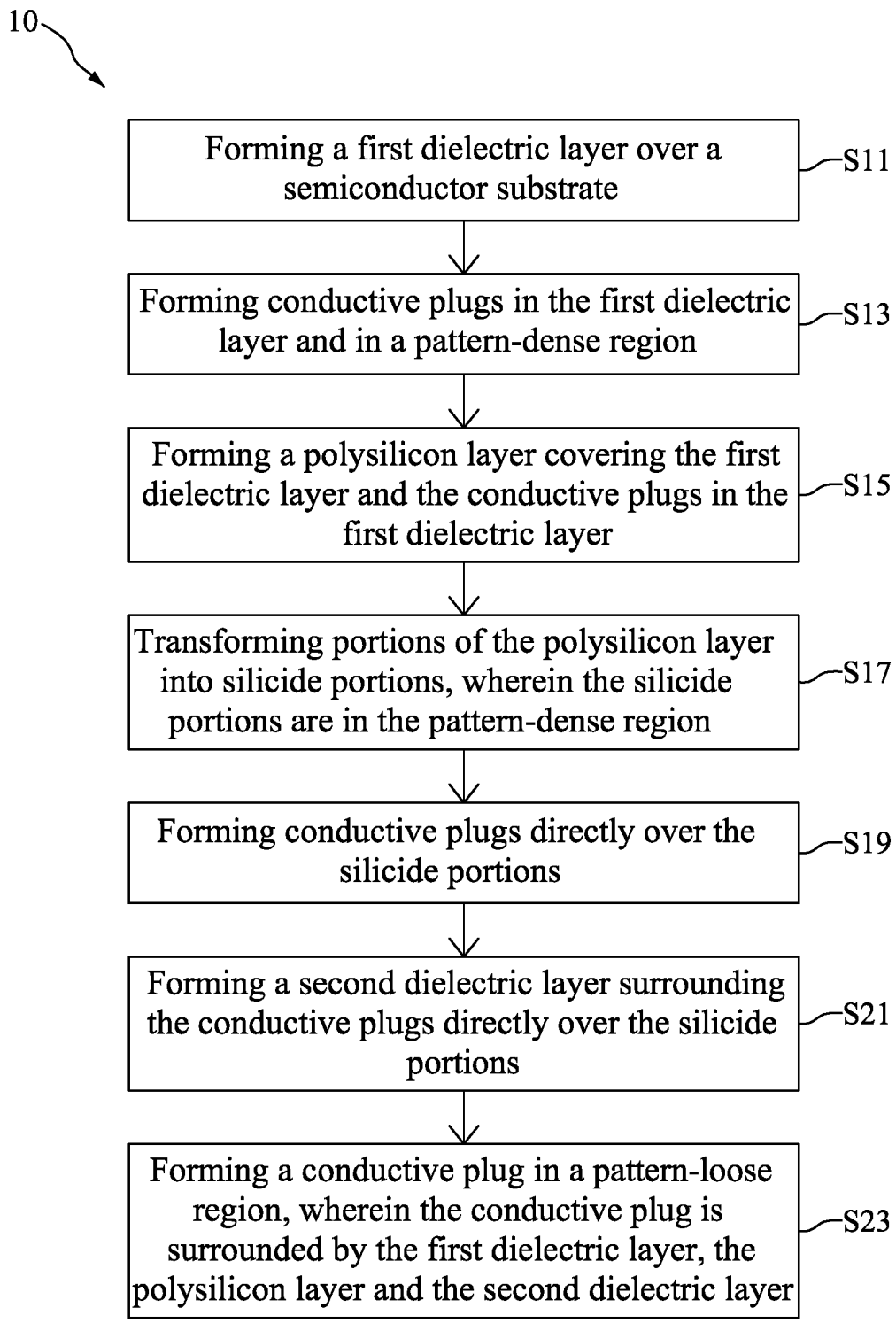
FIG. 4 is a flow diagram illustrating a method for preparing a semiconductor device structure according to various embodiments of the present disclosure.

FIG. 4 is a flow diagram illustrating a method 10 for preparing a semiconductor device structure (e.g., the semiconductor device structure 200), and the method 10 includes steps S11, S13, S15, S17, S19, S21 and S23, in accordance with some embodiments. The steps S11 to S23 of FIG. 4 are elaborated in connection with the following figures, such as FIGS. 5-19.

Figure 5:
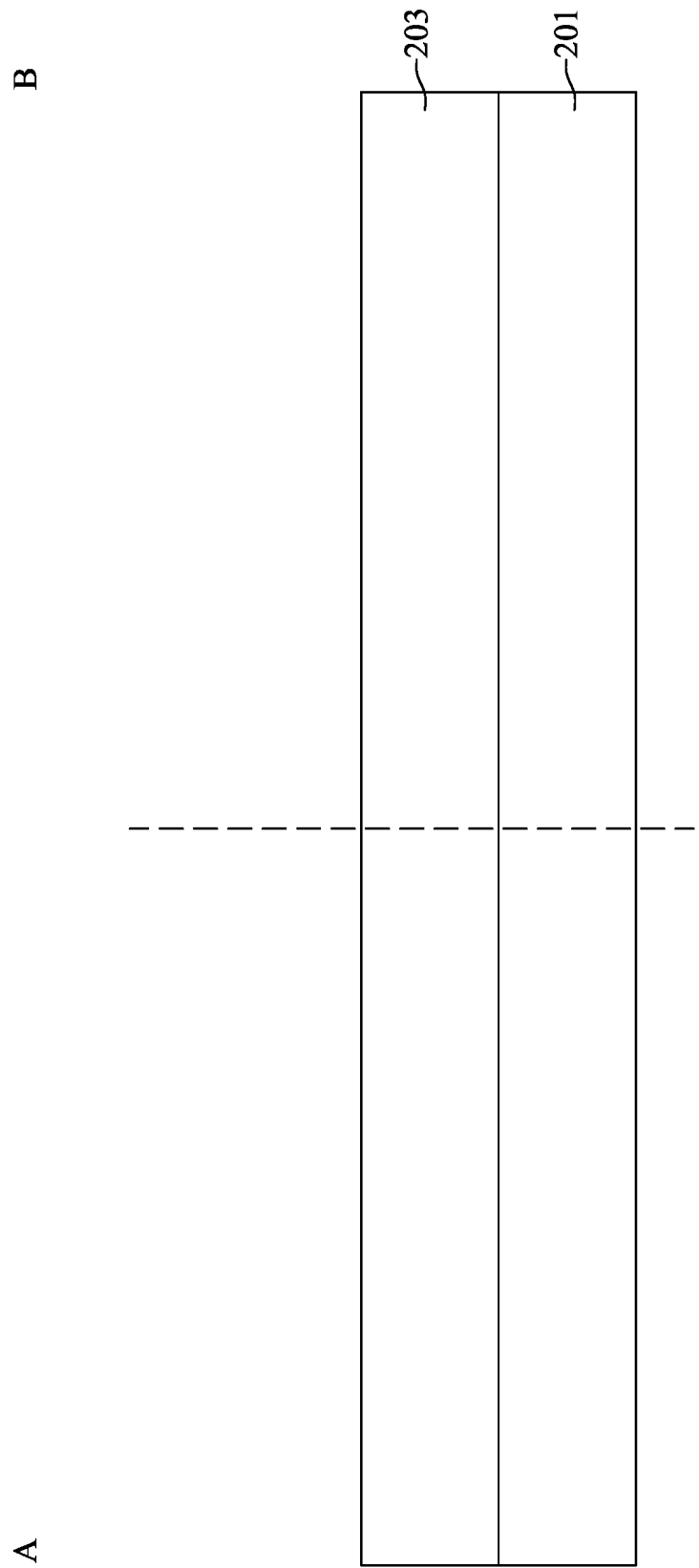
FIG. 5 is a cross-sectional view illustrating an intermediate stage of forming a first dielectric layer over a semiconductor substrate during the formation of the semiconductor device structure according to various embodiments of the present disclosure.

FIGS. 5-19 are cross-sectional views illustrating intermediate stages of forming the semiconductor device structure 200, in accordance with some embodiments. As shown in FIG. 5, a semiconductor substrate 201 is provided. The semiconductor substrate 201 may be a semiconductor wafer such as a silicon wafer.

Alternatively or additionally, the semiconductor substrate 201 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 201 includes an epitaxial layer. For example, the semiconductor substrate 201 has an epitaxial layer overlying a bulk semiconductor. In some embodiments, the semiconductor substrate 201 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 203 is formed over the semiconductor substrate 201, as shown in FIG. 5 in accordance with some embodiments. The respective step is illustrated as the step S11 in the method 10 shown in FIG. 4. In some embodiments, the first dielectric layer 203 is made of silicon oxide, silicon nitride, silicon oxynitride, a low-k dielectric material or another suitable material. The first dielectric layer 203 may be formed by a deposition process, such as a chemical vapor deposition (CVD) process, a physical vapor deposition (PVD) process, an atomic layer deposition (ALD) process, a spin-on coating process, or another suitable method.

Figure 6:
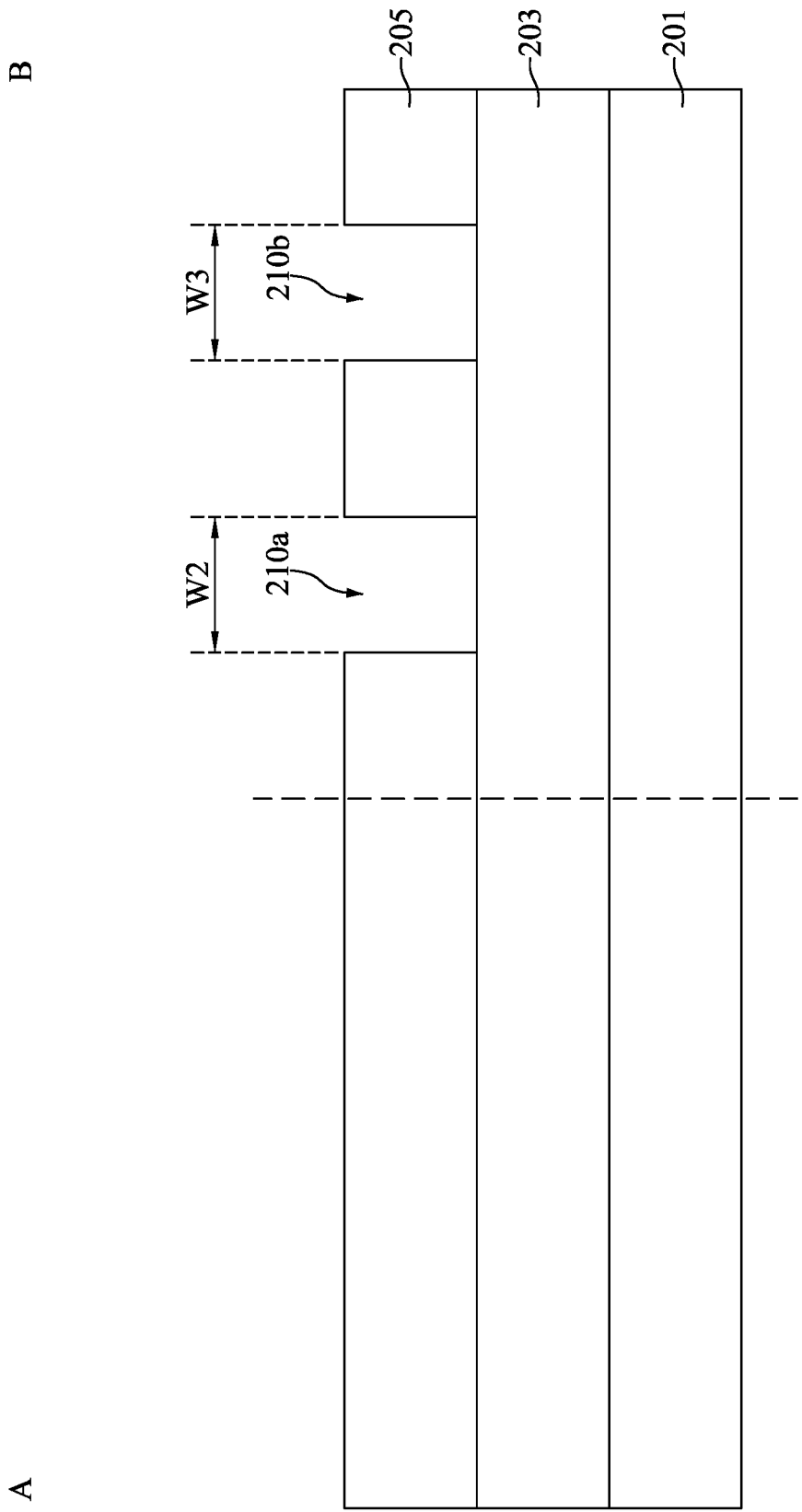
FIG. 6 is a cross-sectional view illustrating an intermediate stage of forming a patterned mask over the first dielectric layer during the formation of the semiconductor device structure according to various embodiments of the present disclosure.

Subsequently, a patterned mask 205 with openings 210a and 210b is formed over the first dielectric layer 203, as shown in FIG. 6 in accordance with some embodiments. In some embodiments, the openings 210a and 210b are in the pattern-dense region B, such that the portion of the first dielectric layer 203 in the pattern-dense region B is partially exposed by the openings 210a and 210b. In some embodiments, the portion of the first dielectric layer 203 in the pattern-loose region A is entirely covered by the patterned mask 205. In addition, the opening 210a has a width W2, and the opening 210b has a width W3. In some embodiments, the width W2 is substantially the same as the width W3.

Figure 7:
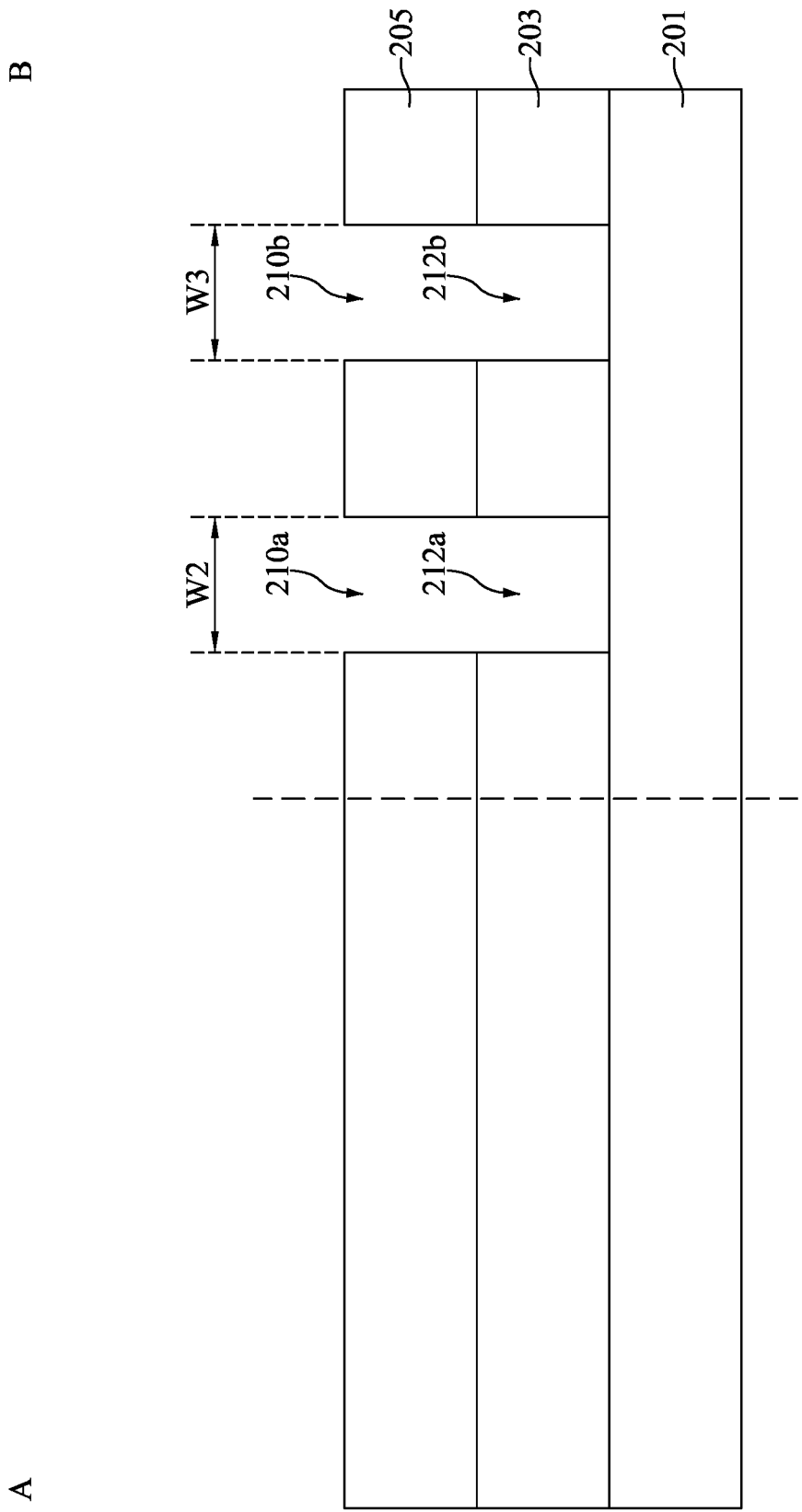
FIG. 7 is a cross-sectional view illustrating an intermediate stage of etching the first dielectric layer to form openings exposing the semiconductor substrate during the formation of the semiconductor device structure according to various embodiments of the present disclosure.

Then, an etching process is performed on the first dielectric layer 203 using the patterned mask 205 as a mask, such that openings 212a and 212b are formed in the first dielectric layer 203, as shown in FIG. 7 in accordance with some embodiments. In some embodiments, the openings 212a and 212b penetrate through the first dielectric layer 203, such that the semiconductor substrate 201 is exposed. The etching process may be a wet etching process, a dry etching process, and a combination thereof.

Since the openings 212a and 212b are formed by transferring the pattern in the patterned mask 205, the width of the opening 212a is substantially the same as the width W2 of the opening 210a, and the width of the opening 212b is substantially the same as the width W3 of the opening 210b. In some embodiments, the openings 212a and 212b have the same widths. After the openings 212a and 212b are formed, the patterned mask 205 may be removed.

Figure 8:
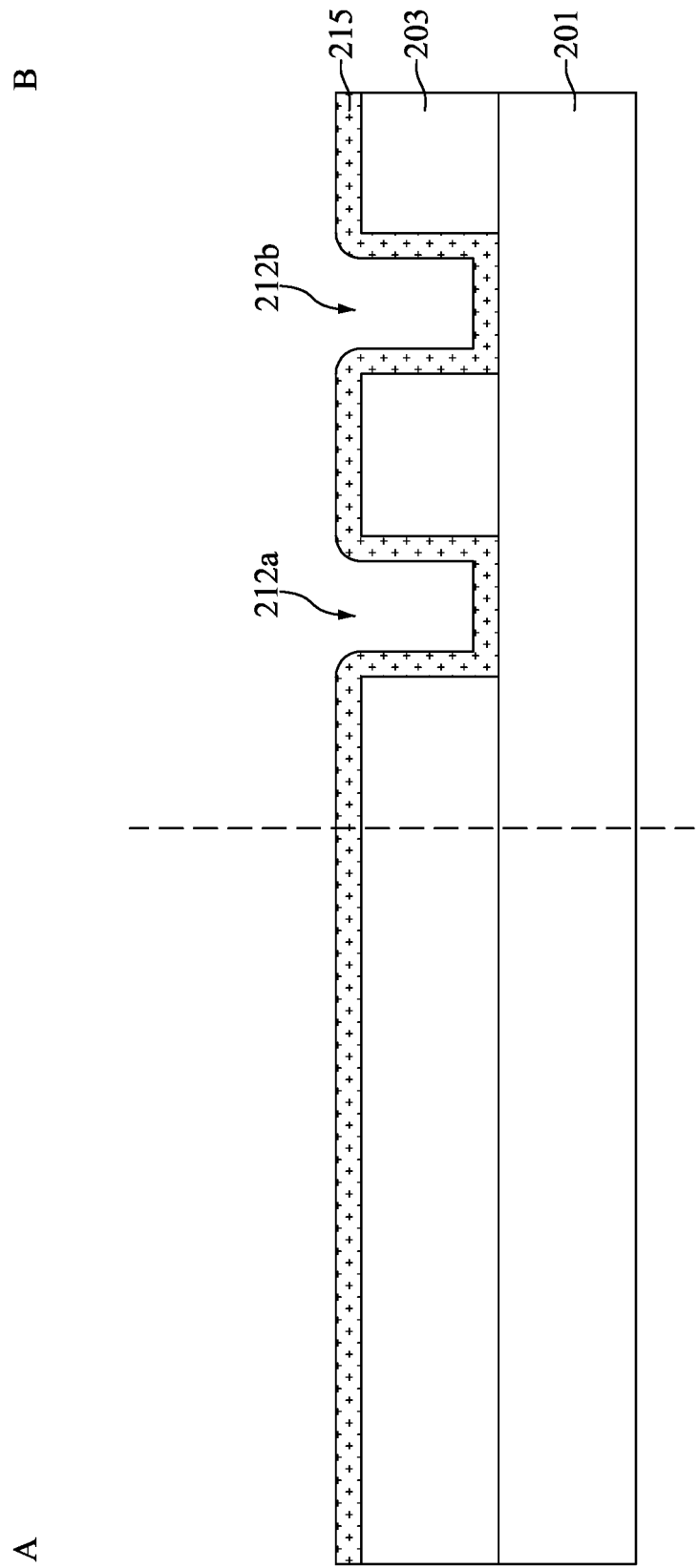
FIG. 8 is a cross-sectional view illustrating an intermediate stage of forming a lining material over the first dielectric layer and lining the openings during the formation of the semiconductor device structure according to various embodiments of the present disclosure.

Next, a lining material 215 is formed over the first dielectric layer 203 and lining the openings 212a and 212b, as shown in FIG. 8 in accordance with some embodiments. In some embodiments, the lining material 215 includes titanium (Ti), titanium nitride (TiN), tantalum (Ta), tantalum nitride (TaN), cobalt tungsten (CoW), another suitable material, or a combination thereof. Moreover, the lining material 215 may be formed by a deposition process, such as a CVD process, a PVD process, an ALD process, a metal organic chemical vapor deposition (MOCVD) process, a sputtering process, a plating process, or another suitable process.

Figure 9:
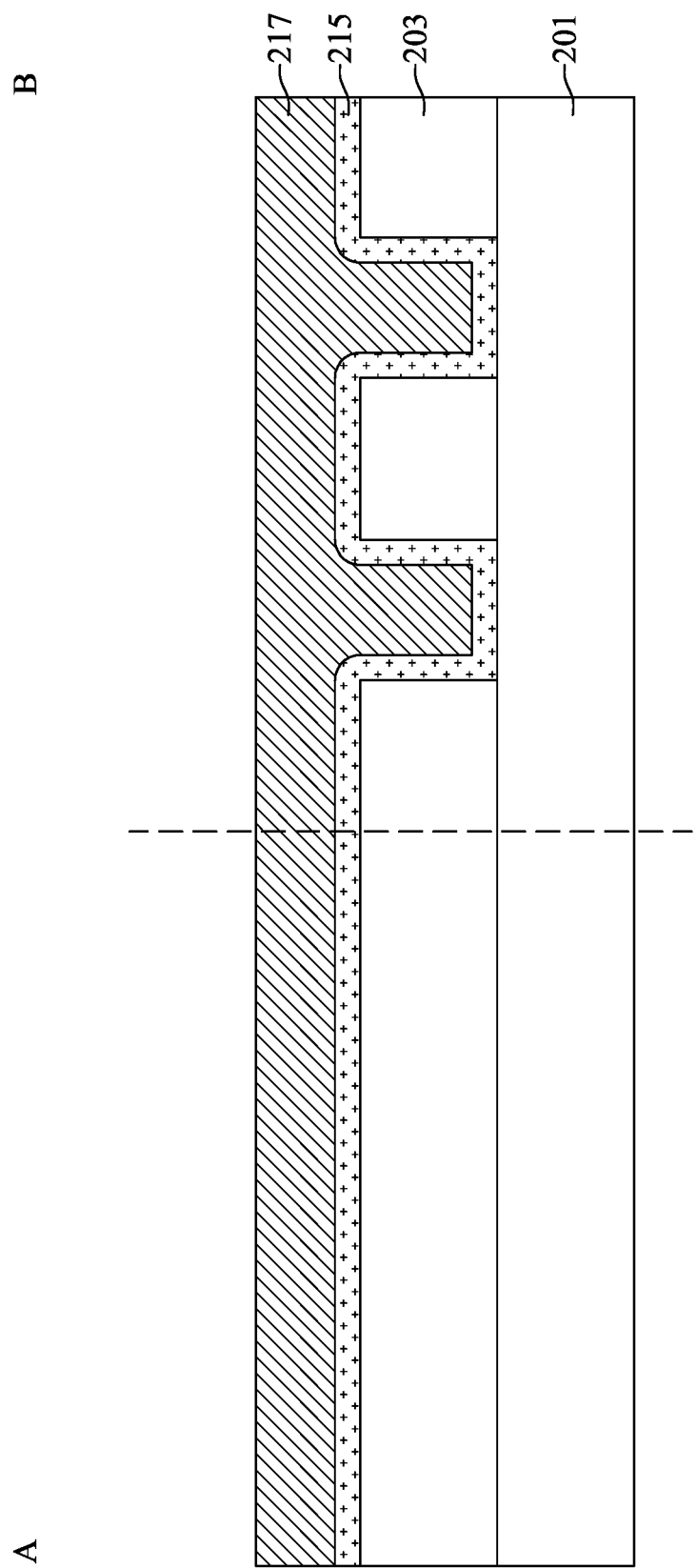
FIG. 9 is a cross-sectional view illustrating an intermediate stage of forming a conductive material over the lining material and filling the openings during the formation of the semiconductor device structure according to various embodiments of the present disclosure.

Substantially, a conductive material 217 is formed over the lining material 215 and filling the openings 212a and 212b, as shown in FIG. 9 in accordance with some embodiments. In some embodiments, the conductive material 217 includes copper (Cu), aluminum (Al), tungsten (W), titanium (Ti), tantalum (Ta), gold (Au), silver (Ag), another suitable material, or a combination thereof. Some processes used to form the conductive material 217 are similar to, or the same as those used to form the lining material 215, and details thereof are not repeated herein.

Figure 10:
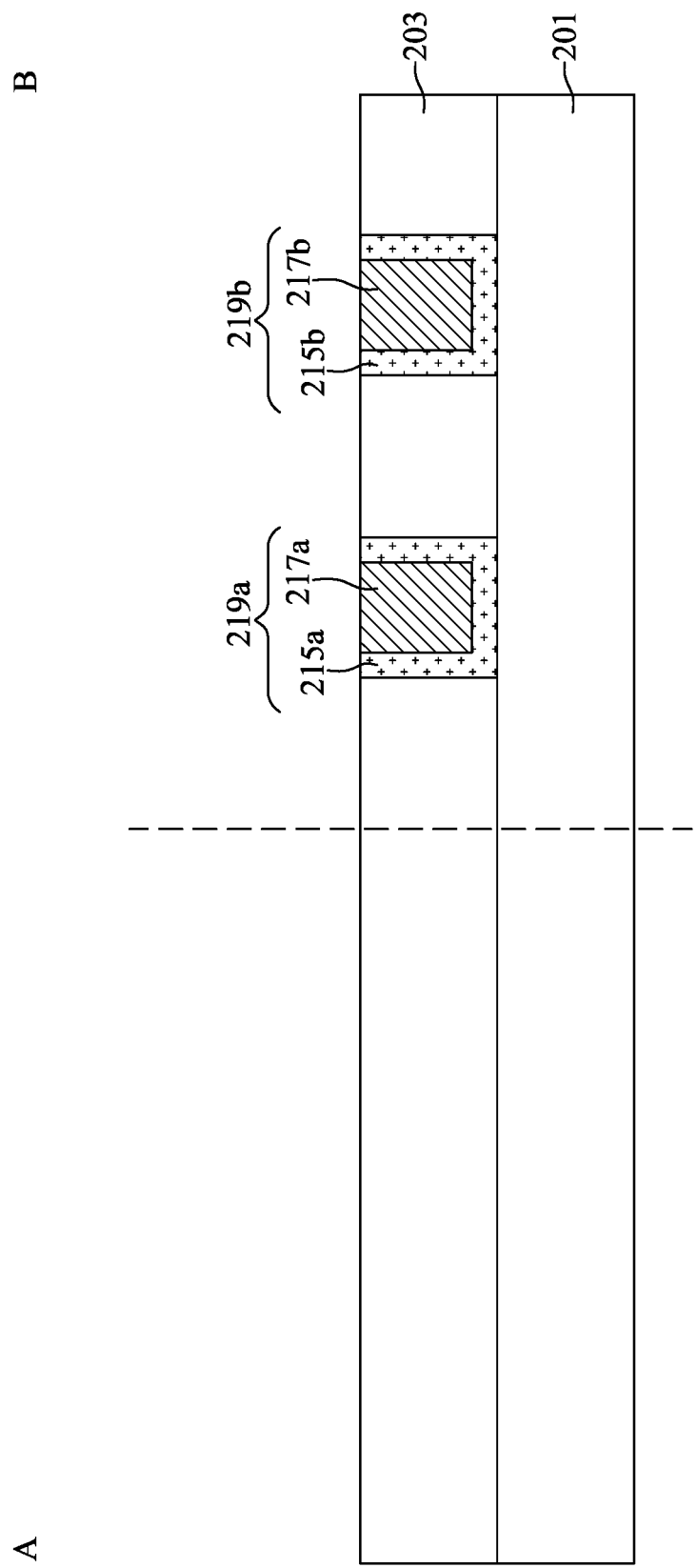
FIG. 10 is a cross-sectional view illustrating an intermediate stage of planarizing the lining material and the conductive material to form liners and conductive plugs in the first dielectric layer during the formation of the semiconductor device structure according to various embodiments of the present disclosure.

Then, a planarization process is performed on the lining material 215 and the conductive material 217 until the first dielectric layer 203 is exposed, as shown in FIG. 10 in accordance with some embodiments. In some embodiments, after the planarization process is performed, conductive structures 219a (including a liner 215a and a conductive plug 217a) and 219b (including a liner 215b and a conductive plug 217b) are formed in the pattern-dense region B. The planarization process may include a chemical mechanical polishing (CMP) process. The respective step is illustrated as the step S13 in the method 10 shown in FIG. 4.

Figure 11:
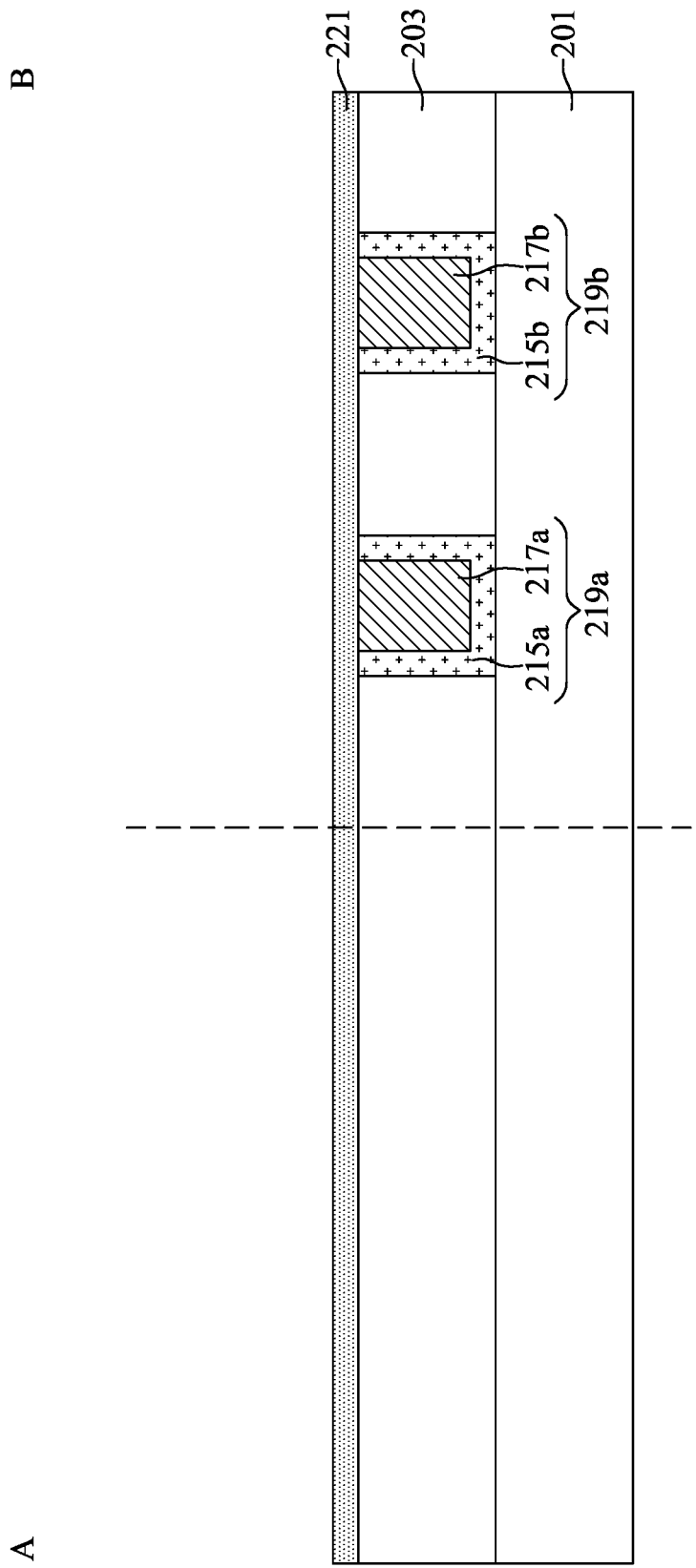
FIG. 11 is a cross-sectional view illustrating an intermediate stage of forming a polysilicon layer over the first dielectric layer and covering the liners and the conductive plugs during the formation of the semiconductor device structure according to various embodiments of the present disclosure.

Next, a polysilicon layer 221 is formed over the first dielectric layer 203 and covering the conductive structures 219a and 219b, as shown in FIG. 11 in accordance with some embodiments. The respective step is illustrated as the step S15 in the method 10 shown in FIG. 4. In some embodiments, the polysilicon layer 221 covers the pattern-dense region A and the pattern-loose region B. In some embodiments, the polysilicon layer 221 is formed by a deposition process, such as a CVD process, a PVD process, an ALD process, a spin-on coating process, or another suitable method.

Figure 12:
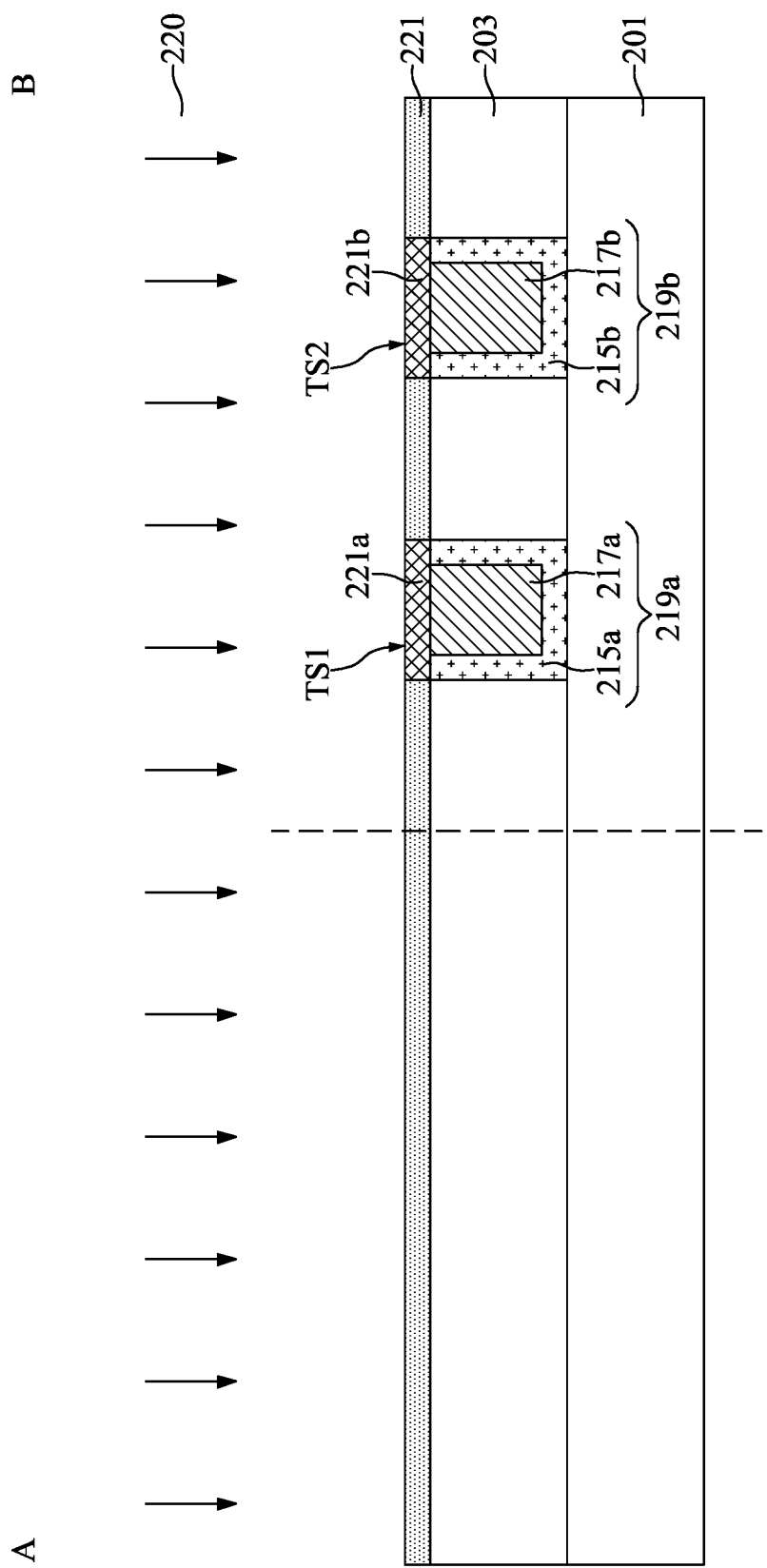
FIG. 12 is a cross-sectional view illustrating an intermediate stage of transforming portions of the polysilicon layer into silicide portions during the formation of the semiconductor device structure according to various embodiments of the present disclosure.

Substantially, a heat treatment process 220 is performed on the polysilicon layer 221 such that portions of the polysilicon layer 221 are transformed into silicide portions 221a and 221b, as shown in FIG. 12 in accordance with some embodiments. In some embodiments, the silicide portions 221a and 221b are formed in the pattern-dense region B. The respective step is illustrated as the step S17 in the method 10 shown in FIG. 4.

In some embodiments, the portions of the polysilicon layer 221 covered by and in direct contact with the conductive structures 219a, 219b are transformed into the silicide portions 221a, 221b by the heat treatment process 220 due to the reaction between the materials of the conductive structures 219a, 219b and the polysilicon layer 221. In some embodiments, after the heat treatment process, the silicide portion 221a has a top surface area TS1, and the silicide portion 221b has a top surface area TS2.

Figure 13:
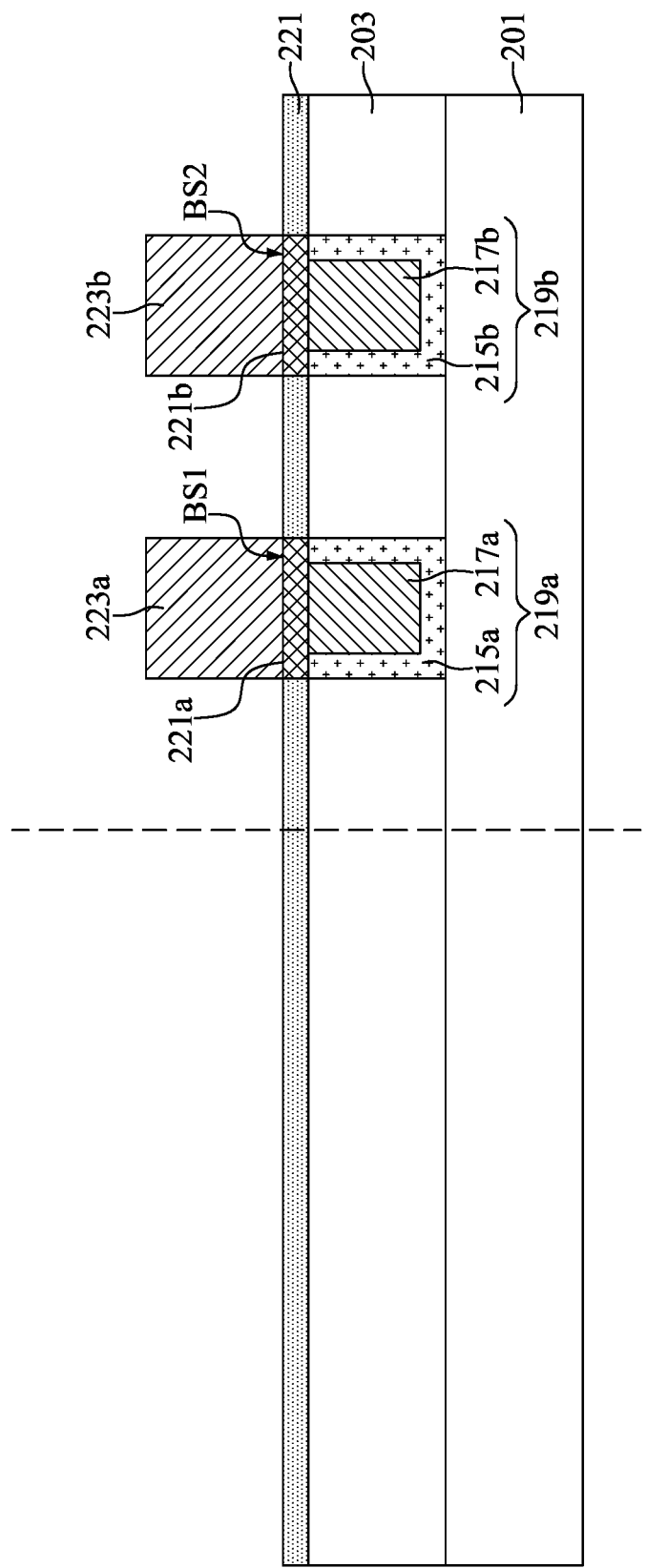
FIG. 13 is a cross-sectional view illustrating an intermediate stage of forming conductive plugs directly over the silicide portions during the formation of the semiconductor device structure according to various embodiments of the present disclosure.

Then, conductive plugs 223a and 223b are formed directly over the silicide portions 221a and 221b, as shown in FIG. 13 in accordance with some embodiments. The respective step is illustrated as the step S19 in the method 10 shown in FIG. 4. In some embodiments, the silicide portion 221a is disposed between and in direct contact with the conductive structure 219a and the conductive plug 223a, and the silicide portion 221b is disposed between and in direct contact with the conductive structure 219b and the conductive plug 223b.

In some embodiments, the material of the conductive plugs 223a and 223b includes copper (Cu), aluminum (Al), tungsten (W), titanium (Ti), tantalum (Ta), gold (Au), silver (Ag), another suitable metal material, or a combination thereof. In some embodiments, the conductive plugs 223a and 223b are formed by a deposition process, such as a CVD process, a PVD process, an ALD process, an MOCVD process, a sputtering process, a plating process, or another suitable process.

In some embodiments, the deposition process for forming the conductive plugs 223a, 223b are selective such that they are deposited on the silicide portions 221a, 221b, but not on the polysilicon layer 221 (i.e., the remaining portion of the polysilicon layer 221 after the heat treatment process 220). The selective deposition process may be achieved since the silicide portions 221a and 221b have a higher tendency to adsorb or react to the metal material of the conductive plugs 223a, 223b than the polysilicon layer 221. Therefore, the conductive plugs 223a, 223b are formed with openings between them, and the polysilicon layer 221 are exposed by the openings.

In some embodiments, the width of the silicide portion 221a is substantially the same as the width of the conductive plug 223a, and the width of the silicide portion 221b is substantially the same as the width of the conductive plug 223b. In some embodiments, the conductive plug 223a has a bottom surface area BS1, the conductive plug 223b has a bottom surface area BS2. Referring to FIGS. 12 and 13, the top surface area TS1 of the silicide portion 221a is substantially the same as the bottom surface area BS1 of the conductive plug 223a, and the top surface area TS2 of the silicide portion 221b is substantially the same as the bottom surface area BS2 of the conductive plug 223b, in accordance with some embodiments.

Figure 14:
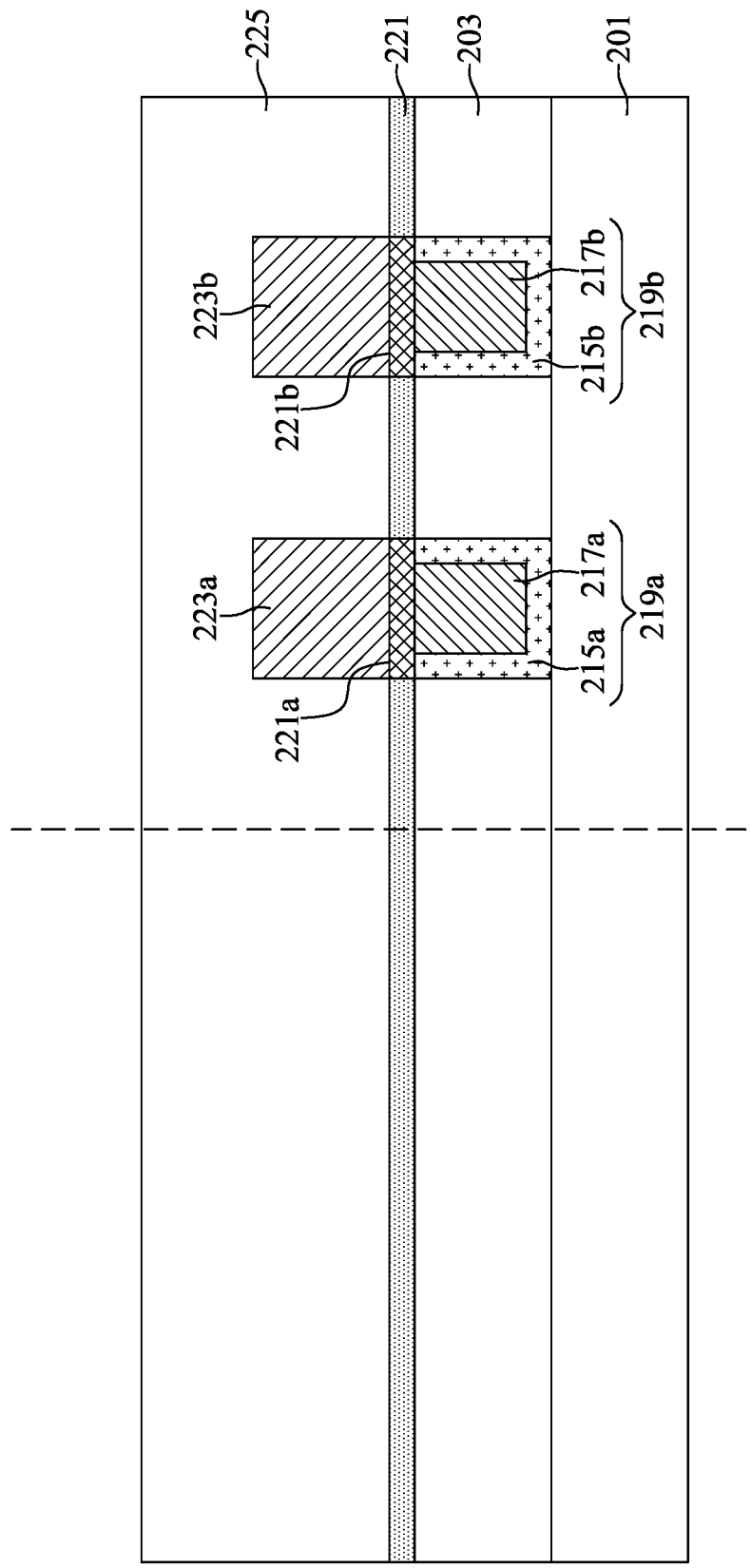
FIG. 14 is a cross-sectional view illustrating an intermediate stage of forming a second dielectric layer covering the polysilicon layer and the conductive plugs over the silicide portions during the formation of the semiconductor device structure according to various embodiments of the present disclosure.

Next, a second dielectric layer 225 is formed covering the polysilicon layer 221 and the conductive plugs 223a, 223b, as shown in FIG. 14 in accordance with some embodiments. In some embodiments, the openings between the conductive plugs 223a and 223b are entirely filled by the second dielectric layer 225. Some materials and processes used to form the second dielectric layer 225 are similar to, or the same as those used to form the first dielectric layer 203, and details thereof are not repeated herein.

Figure 15:
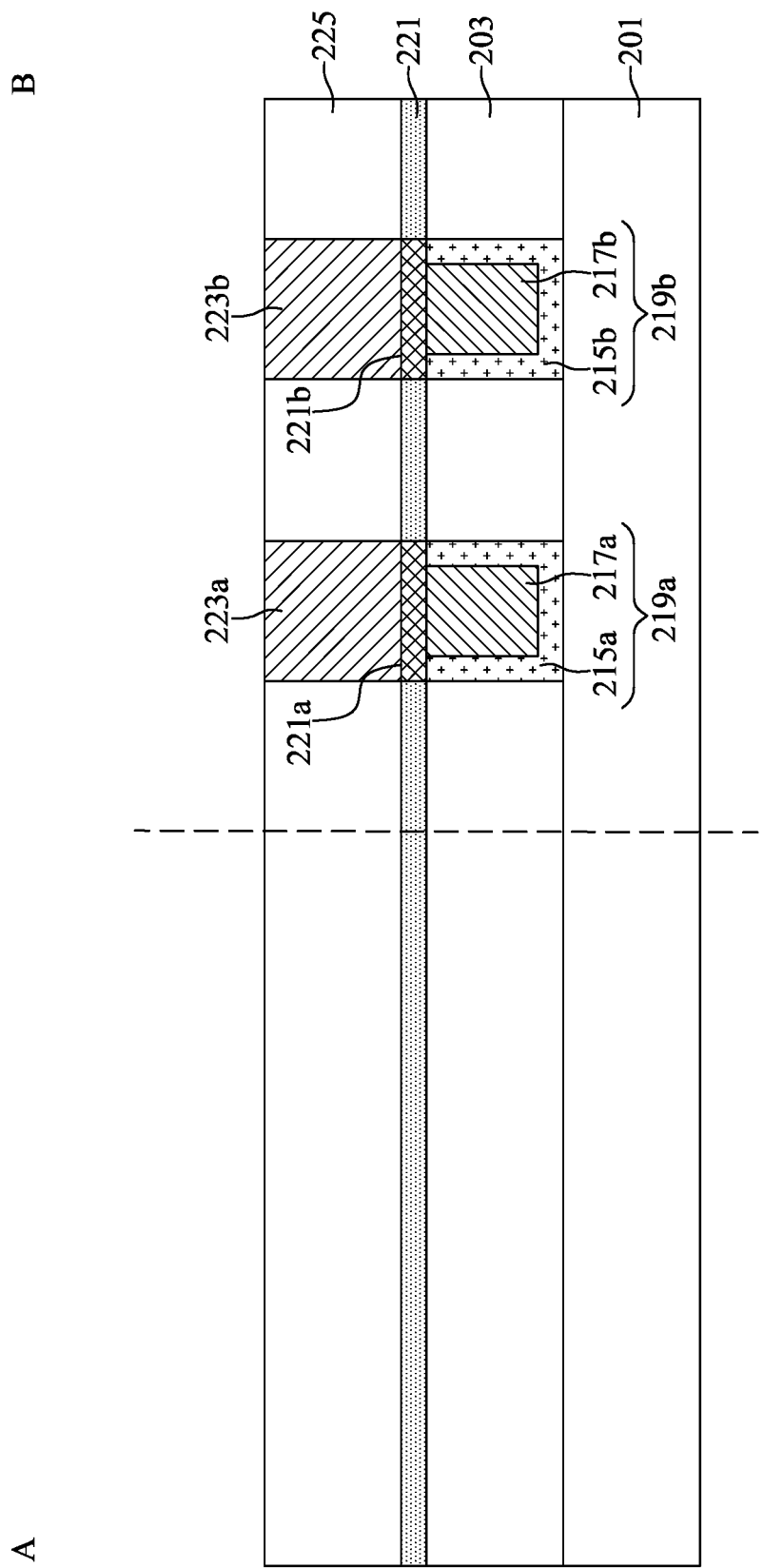
FIG. 15 is a cross-sectional view illustrating an intermediate stage of planarizing the second dielectric layer to expose the conductive plugs in the second dielectric layer during the formation of the semiconductor device structure according to various embodiments of the present disclosure.

Substantially, a planarization process is performed on the second dielectric layer 225, such that the top surfaces of the conductive plugs 223a and 223b are exposed, as shown in FIG. 15 in accordance with some embodiments. The planarization process may include a CMP process. In some embodiments, the sidewalls of the conductive plugs 223a and 223b are surrounded by the second dielectric layer 225. The respective step is illustrated as the step S21 in the method 10 shown in FIG. 4.

Figure 16:
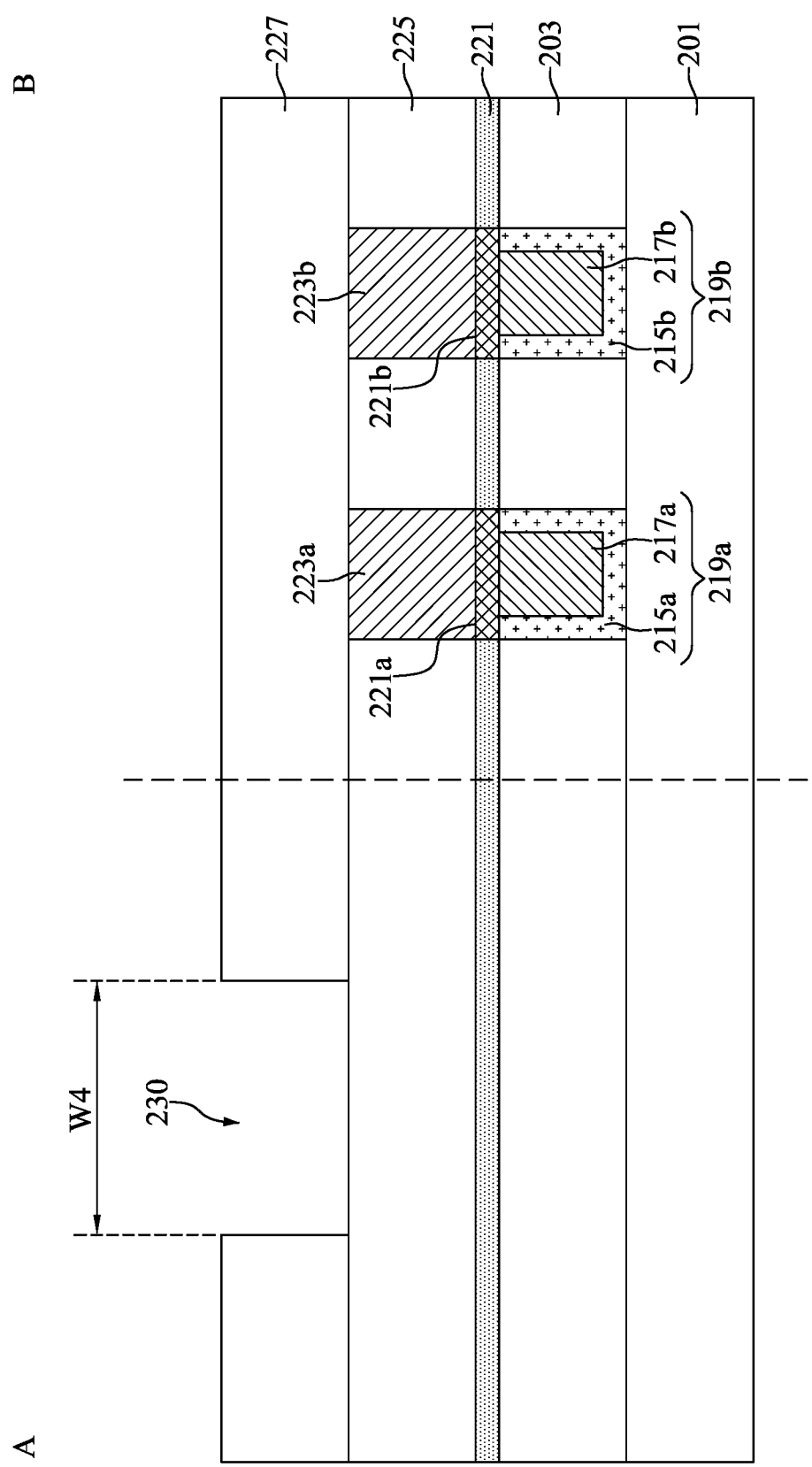
FIG. 16 is a cross-sectional view illustrating an intermediate stage of forming a patterned mask over the second dielectric layer during the formation of the semiconductor device structure according to various embodiments of the present disclosure.

Then, a patterned mask 227 with an opening 230 is formed over the second dielectric layer 225, as shown in FIG. 16 in accordance with some embodiments. In some embodiments, the opening 230 is in the pattern-loose region A, such that the portion of the second dielectric layer 225 in the pattern-loose region A is partially exposed by the opening 230. In some embodiments, the portion of the second dielectric layer 225 in the pattern-dense region B is entirely covered by the patterned mask 227. In addition, the opening 230 has a width W4. Referring to FIGS. 6 and 16, the width W4 is greater than each of the widths W2 and W3.

Figure 17:
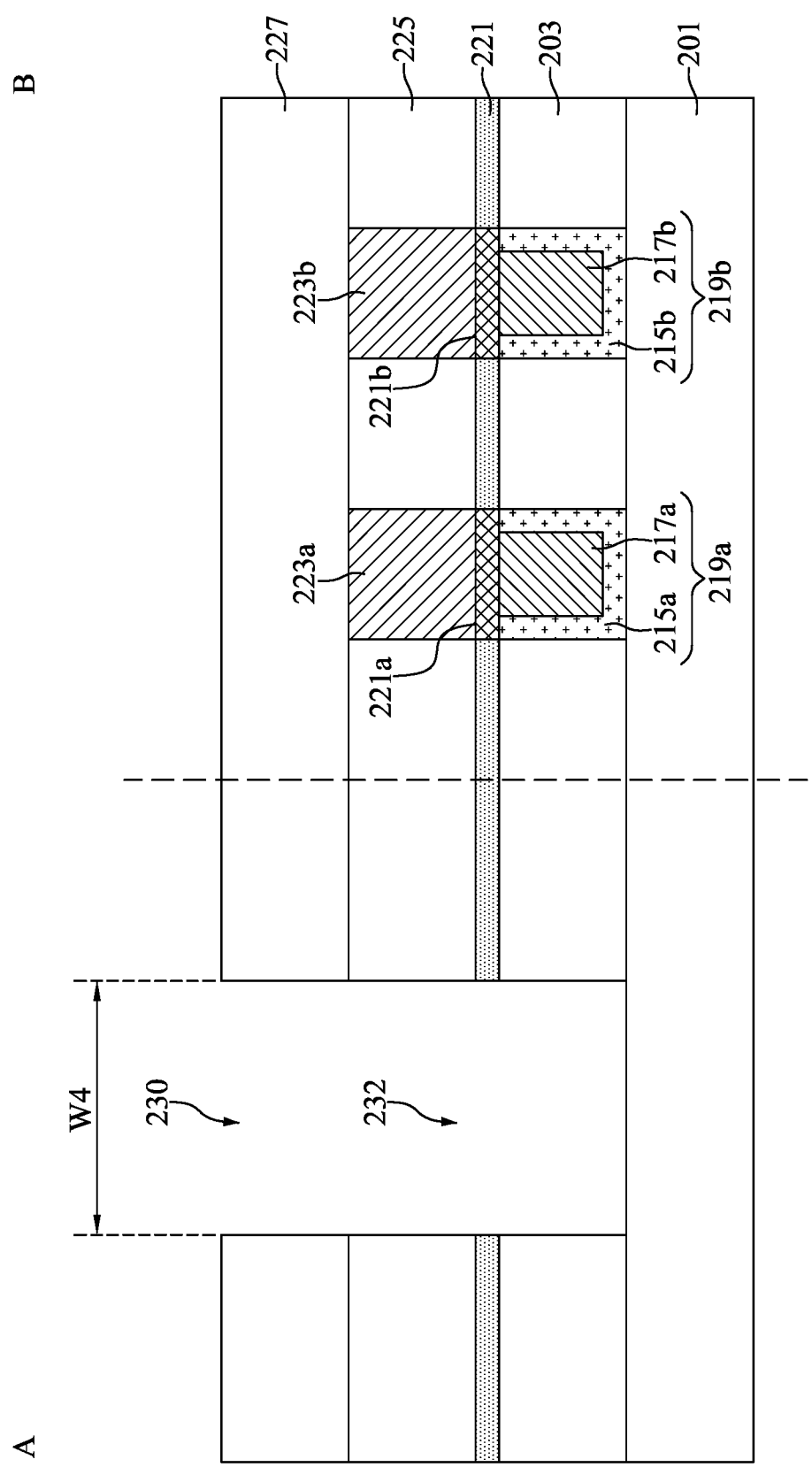
FIG. 17 is a cross-sectional view illustrating an intermediate stage of etching the first dielectric layer, the polysilicon layer and the second dielectric layer during the formation of the semiconductor device structure according to various embodiments of the present disclosure.

Next, an etching process is performed on the second dielectric layer 225 using the patterned mask 227 as a mask, such that an opening 232 is formed in the second dielectric layer 225, the polysilicon layer 221 and the first dielectric layer 203, as shown in FIG. 17 in accordance with some embodiments. In some embodiments, the opening 232 penetrates through the second dielectric layer 225, the polysilicon layer 221 and the first dielectric layer 203, such that the semiconductor substrate 201 is exposed. The etching process may be a wet etching process, a dry etching process, and a combination thereof. Since the opening 232 is formed by transferring the pattern in the patterned mask 227, the width of the opening 232 is substantially the same as the width W4 of the opening 230. After the opening 232 is formed, the patterned mask 227 may be removed.

Figure 18:
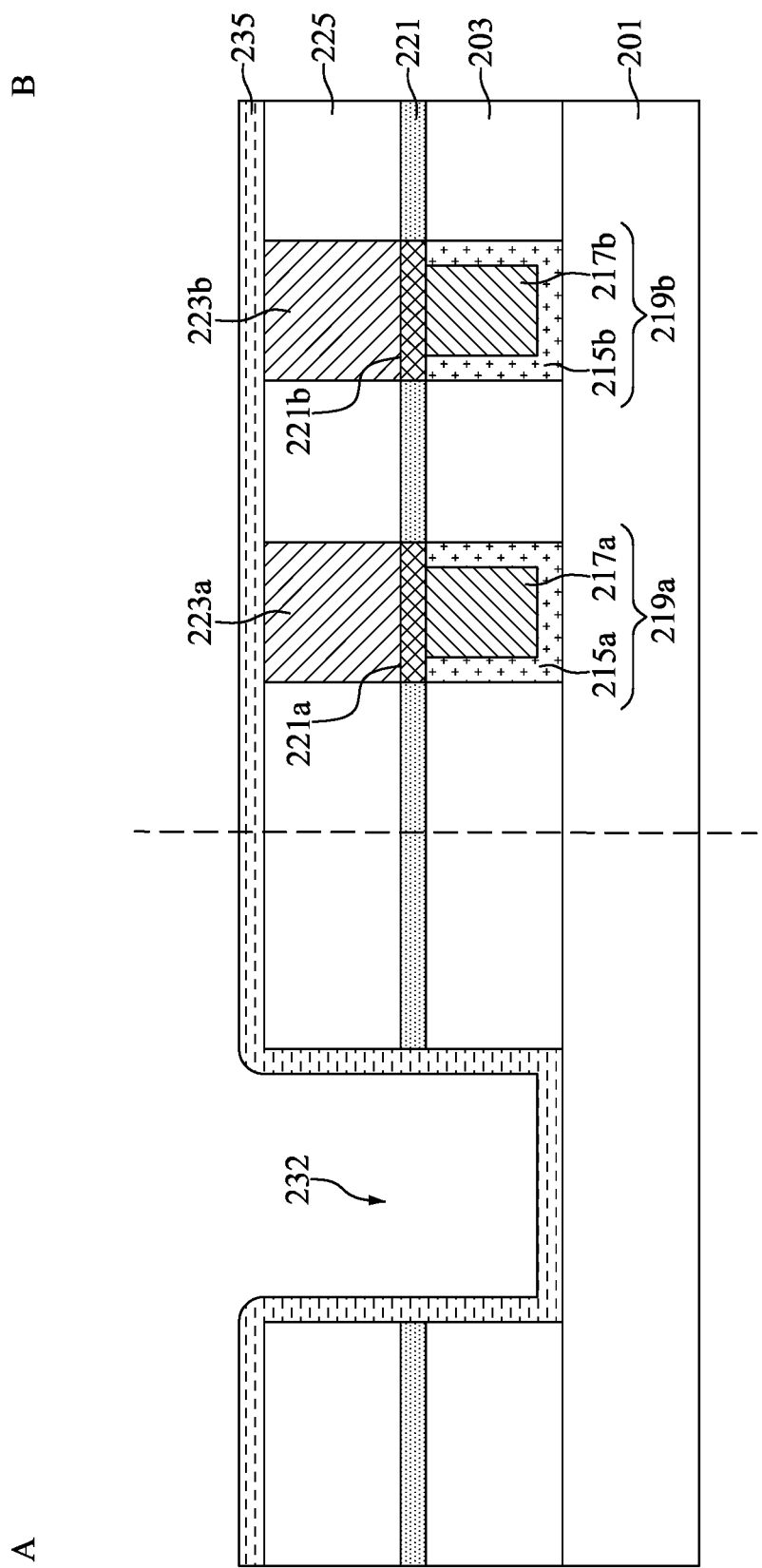
FIG. 18 is a cross-sectional view illustrating an intermediate stage of forming a lining material over the second dielectric layer and lining the opening during the formation of the semiconductor device structure according to various embodiments of the present disclosure.

Substantially, a lining material 235 is formed over the second dielectric layer 225 and lining the opening 232, as shown in FIG. 18 in accordance with some embodiments. In some embodiments, the sidewalls of the second dielectric layer 225, the sidewalls of the polysilicon layer 221, the sidewalls of the first dielectric layer 203, and the top surface of the semiconductor substrate 201 exposed by the opening 232 are covered by the lining material 235. Some materials and processes used to form the lining material 235 are similar to, or the same as those used to form the lining material 215 (FIG. 8), and details thereof are not repeated herein.

Figure 19:
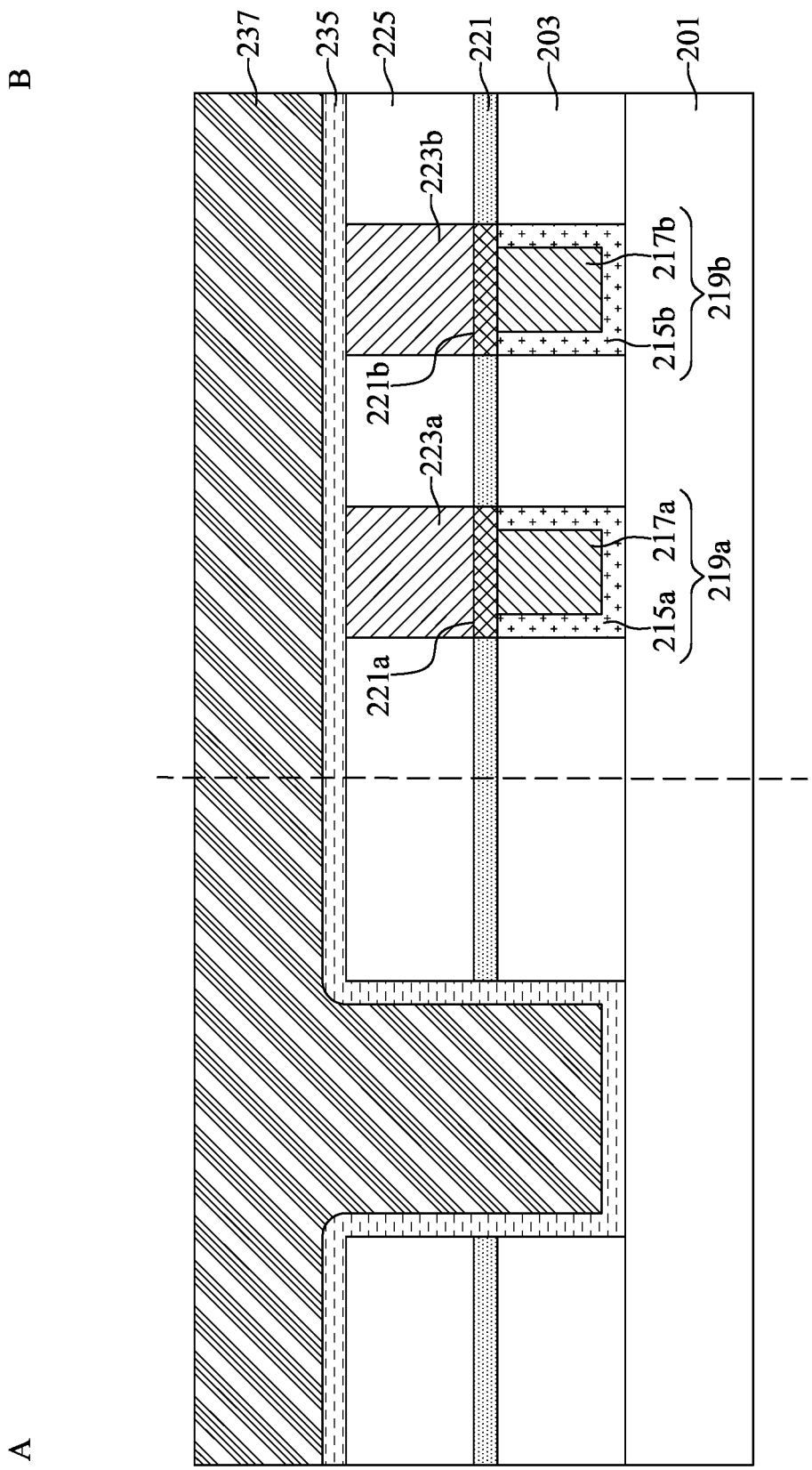
FIG. 19 is a cross-sectional view illustrating an intermediate stage of forming a conductive material over the lining material and filling the opening during the formation of the semiconductor device structure according to various embodiments of the present disclosure.

Then, a conductive material 237 is formed over the lining material 235 and filling the opening 232, as shown in FIG. 19 in accordance with some embodiments. Some materials and processes used to form the conductive material 237 are similar to, or the same as those used to form the conductive material 217 (FIG. 9), and details thereof are not repeated herein.

Referring back to FIG. 3, after the conductive material 237 is formed, a planarization process is performed on the lining material 235 and the conductive material 237 until the second dielectric layer 225 is exposed, in accordance with some embodiments. In some embodiments, after the planarization process is performed, a conductive structure 239a (including a liner 235a and a conductive plug 237a) is formed in the pattern-loose region A. The planarization process may include a CMP process. The respective step is illustrated as the step S23 in the method 10 shown in FIG. 4. After the planarization process is performed, the semiconductor device structure 200 is obtained.

Figure 20:
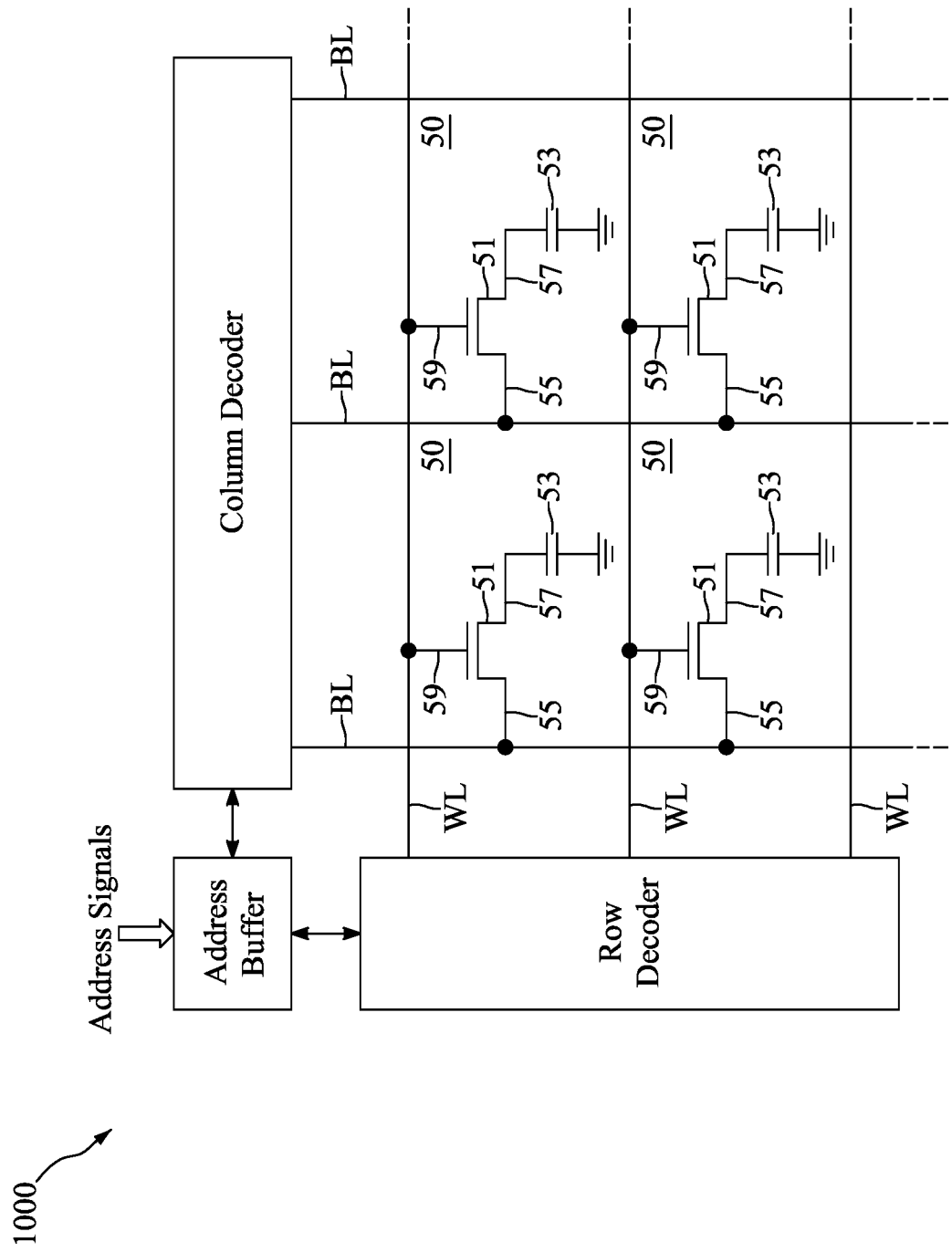
FIG. 20 is a partial schematic illustration of an exemplary integrated circuit, including an array of memory cells in accordance with some embodiments.

FIG. 20 is a partial schematic illustration of an exemplary integrated circuit, such as a memory device 1000, including an array of memory cells 50 according to various embodiments of the present disclosure. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 3, the conductive structure 239a is formed in the pattern-loose region A, while the conductive plugs 223a, 223b, the silicide portions 221a, 221b, and the conductive structures 219a, 219b are formed in the pattern-dense region B. The pattern-loose region A may be any of the regions of the address buffer, the row decoder, or the column decoder in the memory device 1000, and the pattern-dense region B may be any of the regions of the memory cells 50 in the memory device 1000.

Embodiments of the semiconductor device structure 200 and method for preparing the same are provided in the disclosure. In some embodiments, the semiconductor device structure 200 includes a first conductive plug (e.g., the conductive plug 217a) and a second conductive plug (e.g., the conductive plug 223a) directly over the first conductive plug, and a silicide portion (e.g., the silicide portion 221a) disposed between the first conductive plug and the second conductive plug. The processes for forming the two conductive plugs can help to eliminate the problems of having overhang resulting from the difficulties in filling a high aspect ratio opening structure, such as an opening structure penetrating through the second dielectric layer 225, the polysilicon layer 221 and the first dielectric layer 203.

Moreover, the second conductive plug is formed over the silicide portion by a self-aligned process, and the second conductive plug is formed before the surrounding dielectric layer (e.g., the second dielectric layer 225) is formed. Therefore, there is no need to etch the surrounding dielectric layer. As a result, the possibility of gap formation between the conductive plugs and the surrounding dielectric layers can be reduced, and the risk of misalignment between the first conductive plug and the second conductive plug can be prevented. As a result, the performance, reliability and yield of the semiconductor device structure can be improved.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer, and a second conductive plug disposed in the second dielectric layer and directly over the first conductive plug. The semiconductor device structure further includes a silicide portion disposed between the first conductive plug and the second conductive plug.

In another embodiment of the present disclosure, a semiconductor device structure is provided. The semiconductor device structure includes a first dielectric layer disposed over a semiconductor substrate, and a polysilicon layer disposed over the first dielectric layer. The semiconductor device structure also includes a second dielectric layer disposed over the polysilicon layer, and a first conductive plug disposed in the first dielectric layer. The semiconductor device structure further includes a silicide portion disposed in the polysilicon layer and covering the first conductive plug, and a second conductive plug disposed in the second dielectric layer and covering the silicide portion.

In yet another embodiment of the present disclosure, a method for preparing a semiconductor device structure is provided. The method includes forming a first dielectric layer over a semiconductor substrate, and forming a first conductive plug in the first dielectric layer. The method also includes forming a polysilicon layer covering the first dielectric layer and the first conductive plug, and transforming a portion of the polysilicon layer into a silicide portion. The method further includes forming a second conductive plug directly over the silicide portion, and forming a second dielectric layer surrounding the second conductive plug.

The embodiments of the present disclosure have some advantageous features. In some embodiments, the semiconductor device structure includes a first conductive plug and a second conductive plug directly over the first conductive plug, and a silicide portion disposed between the first conductive plug and the second conductive plug. The second conductive plug is formed over the silicide portion by a self-aligned process, and the second conductive plug is formed before the surrounding dielectric layer is formed. Therefore, there is no need to etch the surrounding dielectric layer. As a result, the possibility of gap formation can be reduced, and the risk of misalignment between the first conductive plug and the second conductive plug can be prevented. As a result, the performance, reliability and yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a first dielectric layer over a semiconductor substrate;
    forming a first opening penetrating through the first dielectric layer to expose the semiconductor substrate, wherein the first opening is formed from a top surface of the first dielectric layer to a bottom surface thereof;
    forming a first conductive plug in the first dielectric layer within the first opening that a top surface of the first conductive plug is coplanar with the top surface of the first dielectric layer;
    forming a polysilicon layer covering the top surface of the first dielectric layer and the top surface of the first conductive plug;
    transforming a portion of the polysilicon layer into a silicide portion;
    forming a second conductive plug directly over the silicide portion; and
    forming a second dielectric layer surrounding the second conductive plug;
    wherein a width of the second conductive plug is larger than a width of the first conductive plug.

2. The method for preparing a semiconductor device structure of claim 1, wherein the transforming includes performing a heat treatment process on the polysilicon layer.

3. The method for preparing a semiconductor device structure of claim 1, wherein a bottom surface of the portion of the polysilicon layer is in direct contact with the first conductive plug, wherein the silicide portion is coplanar with a remaining portion of the polysilicon layer.

4. The method for preparing a semiconductor device structure of claim 1, wherein the silicide portion is entirely covered by the second conductive plug before the second dielectric layer is formed.

5. The method for preparing a semiconductor device structure of claim 1, wherein the second dielectric layer is formed over and in direct contact with a remaining portion of the polysilicon layer after the second conductive plug is formed, wherein a width of the second conductive plug is equal to a width of the first opening, wherein a width of the first conductive plug is smaller than the width of the first opening.

6. The method for preparing a semiconductor device structure of claim 1, further comprising:
    forming a lining material over the first dielectric layer and lining the first opening;
    forming a conductive material over the lining material and filling the first opening; and
    planarizing the lining material and the conductive material to form a liner separating the first conductive plug from the first dielectric layer and the semiconductor substrate, wherein the liner has a U-shaped configuration that top ends of the liner are coplanar with the top surface of the first conductive plug.

7. The method for preparing a semiconductor device structure of claim 6, wherein the liner is covered by the polysilicon layer before the portion of the polysilicon layer is transformed, wherein the top ends of the liner are in direct contact with the portion of the polysilicon layer and are contact-less with a remaining portion of the polysilicon layer.

8. The method for preparing a semiconductor device structure of claim 6, wherein the liner is covered by the silicide portion after the portion of the polysilicon layer is transferred, wherein the top ends of the liner are in direct contact with the silicide portion of the polysilicon layer and are contact-less with a remaining portion of the polysilicon layer.

9. The method for preparing a semiconductor device structure of claim 6, further comprising:
    forming a second opening penetrating through the first dielectric layer, the polysilicon layer and the second dielectric layer to expose the semiconductor substrate; and
    forming a third conductive plug in the second opening.

10. The method for preparing a semiconductor device structure of claim 9, wherein the first opening is in a pattern-dense region, and the second opening is in a pattern-loose region.

11. The method for preparing a semiconductor device structure of claim 9, wherein a width of the second opening is greater than a width of the first opening.

* * * * *